United States Patent
Yu

[19]

[11] Patent Number: 5,869,853
[45] Date of Patent: Feb. 9, 1999

[54] LINEAR CHARGE-COUPLED DEVICE HAVING IMPROVED CHARGE TRANSFERRING CHARACTERISTICS

[75] Inventor: Young-Jun Yu, Seoul, Rep. of Korea

[73] Assignee: LG Semicon Co., Ltd., Cheongju-Al, Rep. of Korea

[21] Appl. No.: 784,388

[22] Filed: Jan. 17, 1997

[30] Foreign Application Priority Data

Jan. 17, 1996 [KR] Rep. of Korea ............... 1996-982

[51] Int. Cl.⁶ .................. H01L 27/148; H01L 29/768
[52] U.S. Cl. .............. 257/222; 257/221; 257/234; 257/248
[58] Field of Search ................. 257/221, 222, 257/232–234

[56] References Cited

U.S. PATENT DOCUMENTS

| | | | |
|---|---|---|---|
| 4,117,514 | 9/1978 | Terui et al. ................. | 257/234 |
| 4,174,528 | 11/1979 | White ......................... | 257/234 |
| 4,489,423 | 12/1984 | Suzuki ........................ | 257/232 |
| 4,518,978 | 5/1985 | Takeshiba ................... | 257/232 |
| 4,935,794 | 6/1990 | Miyatake .................... | 257/232 |
| 5,060,038 | 10/1991 | Kimata et al. .............. | 251/232 |
| 5,521,405 | 5/1996 | Nakashiba ................... | 257/221 |

*Primary Examiner*—Gene M. Munson

[57] ABSTRACT

A linear CCD (charge-coupled device) including: a photodiode-array having a plurality of photodiodes for converting incident light plural charges, respectively; and a charge transfer part for transferring the charges of the photodiodes during a first phase of a first and second clock signal and for moving the charges during a second phase of the first and second clock signals. The charge transfer part includes: plural first shift electrodes connected to the photodiodes, respectively, for forming potential wells that receive charges from the photodiodes, respectively, during the first phase of the first and second clock signals; and plural second shift electrodes located between the first shift electrodes, respectively, for forming potential wells that receive the charges from the potential wells of the first shift electrodes during the second phase of the first and second clock signals. No shift gates are needed between charge outlets of the photodiodes and the first shift electrodes.

7 Claims, 6 Drawing Sheets

LINEAR CHARGE-COUPLED DEVICE HAVING IMPROVED CHARGE TRANSFERRING CHARACTERISTICS

BACKGROUND OF THE INVENTION

The present invention relates to a charge-coupled device (CCD), and more particularly, to the structure of a linear CCD and a method of operating the same, in which the structure of the connecting part of a photodiode and a charge transfer part and the transfer method of a signal charge are improved to be suitable for a high speed linear CCD.

A CCD is an imaging device in which, with a pulse voltage applied to a gate electrode, a potential well is formed in the vicinity of the surface of a semiconductor to move charges that exist in the well.

Figure 1:
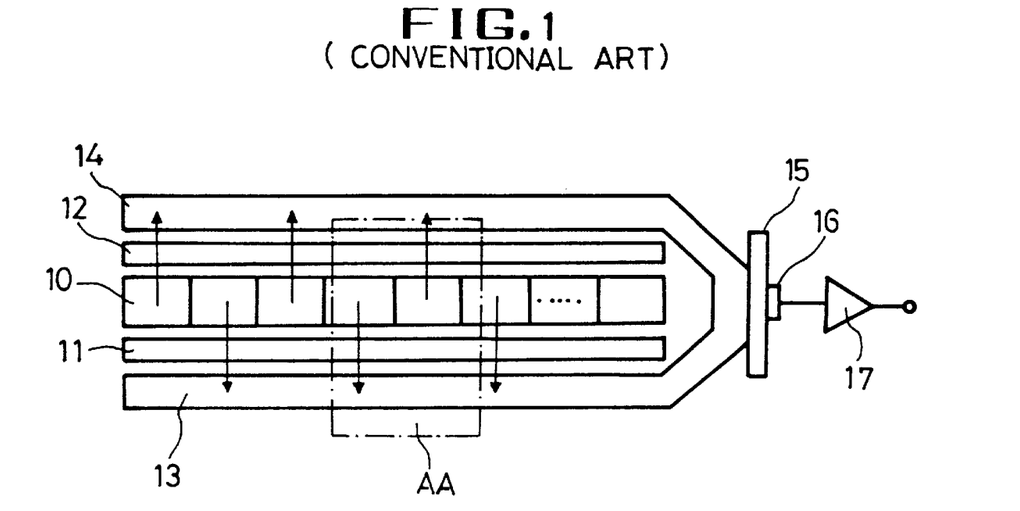
FIG. 1 is a layout diagram of a conventional linear CCD.

As one example of conventional linear CCDs, a schematic layout is shown in FIG. 1. This conventional linear CCD comprises a photodiode-array 10, charge transfer parts (horizontal analog shift resistors) 13 and 14 located on both sides of the photodiode-array, shift gates 11 and 12 for transferring a charge generated from the photodiode 10 to the charge transfer parts 13 and 14, an output gate (OG) 15 for transmitting the charge transferred from charge transfer parts 13 and 14 to an output terminal, and a floating diffusion (FD) 16 receiving the charge transferred in a floating state to transmit it to a sense amp 17.

According to the operation of this linear CCD, when shift gate 11 or 12 is in the ON state, a signal that is photoelectrically-converted in a corresponding photodiode (PD) of the array 10 is transferred to one of the charge transfer parts 13 and 14. The photodiode array is divided into even numbers and odd numbers to transfer the signal to the charge transfer parts located above and below, respectively, in zigzags. For example, if the charge of the odd photodiodes is transferred to the upper part, that of the even photodiodes is transferred to the lower part.

Then, after transferring the signals accumulated in the charge well in the direction of the right side in FIG. 1 by the clock of the charge transfer parts 13 and 14, the signals are extracted by FD 16 and sense amp 17.

Figure 2:
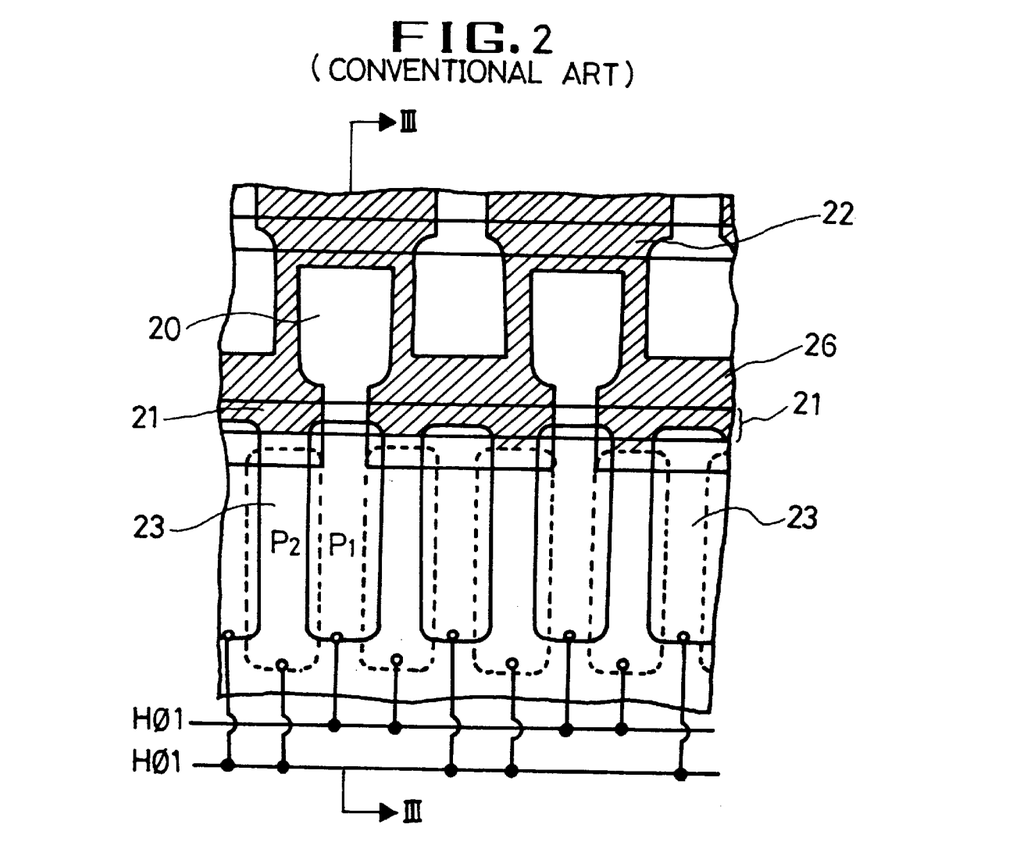
FIG. 2 is a more detailed diagram of the portion AA of FIG. 1.
Figure 3A:
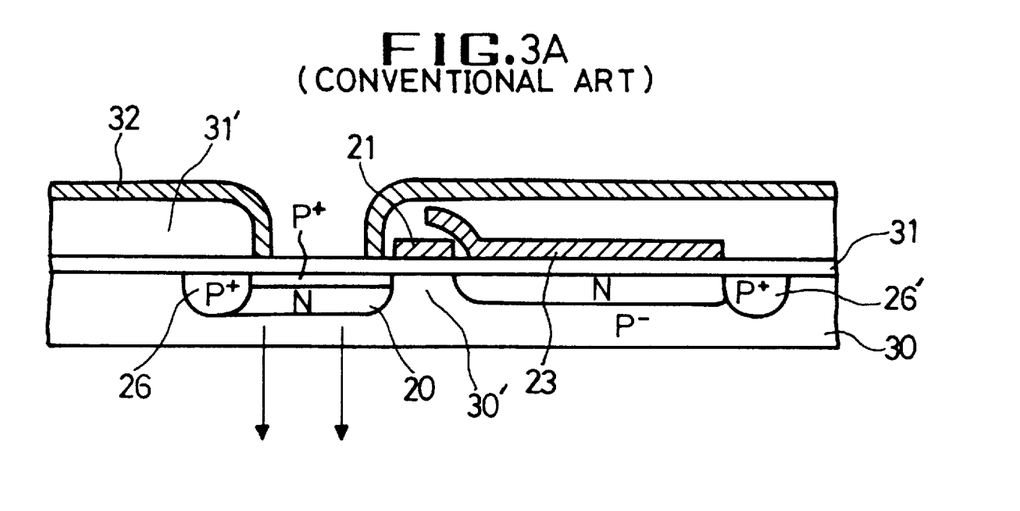
FIG. 3A is a cross-sectional view taken along view-line III—III in FIG. 2.
Figure 3B:
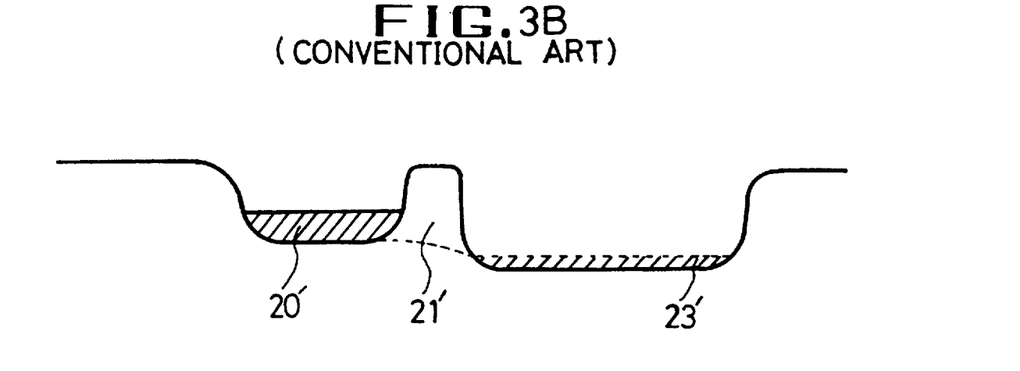
FIG. 3B is a voltage level diagram corresponding to FIG. 3A.

FIG. 2 shows in greater detail the portion AA of FIG. 1. FIG. 3A is a cross-sectional view taken along view-line III—III in FIG. 2. FIG. 3B shows the potential in this section.

A photodiode (photo cell) 20 forms a P-N junction with a channel stop region 26 and one side of a shift gate 21 as the boundary, in a P-type substrate 30. Shift electrodes (P1, P2) 23 of a charge transfer part, e.g., 13 or 14, are formed on the N-type doped substrate region with an insulating layer 31 imposed therebetween, respectively. Between shift electrodes 23 and photodiode 20, a shift gate 21 is formed on the substrate, with insulating layer 31 imposed therebetween. Channel stop region 26 is formed on the other side of shift gate 21. The part excluding photodiode 20 is covered with a light-shielding film 32 and an insulating layer 31' interposed therebetween.

Considering the operation of such conventional linear CCD, when a signal voltage is applied to shift gate (11 and 12 in FIG. 1 or 21 in FIG. 2 because only part of one side is shown), the potential 21' below shift gate 21 is lowered as shown in dotted line in FIG. 3B. Thus, charges 20' accumulated in the photodiode (shown in a slash mark for convenience sake of explanation) pass under the shift gate and transfer to a well region 23' formed below shift electrode 23. After once transferring the charge of the photodiode to the well 23', the applied voltage of the shift gate is made low immediately to thereby shield the path of the charge.

To shift charges to electrodes P1 and P2 of the charge transfer part, two values of "low" (of "0" V) and "high" (of a certain positive voltage of "H" V) are applied. That is, a pulsed clock repeating a high-low waveform is applied to transfer the charge to the output side.

In other words, for transferring the charge from the photodiode to the well below the shift electrode, in a state that no clock is applied to the shift gate (i.e., in an OFF state as compared to a switch), if applying the high (+V) voltage to the shift electrode and applying the high pulse to shift gate 21, the charge path under the shift gate is opened (is similarly to be turned on in case of switch). Thus, the charges accumulated in the photodiode are transferred to the potential well under the corresponding shift electrode of the charge transfer part that is in contact with the outlet side of the photodiode.

If the movement of the signal charge to the charge transfer part is done, the shift gate enters an OFF state to thereby isolate the photodiode and the channel of the charge transfer part. The clock of the charge transfer part is applied to the shift electrode, thereby transferring the signal charge in the direction of the OG and FD.

According to such a conventional linear CCD, since two shift gates should be utilized between the photodiode-array and the upper and lower charge transfer parts, the structure is complicated. In addition, it is attended with inconvenience that an external pin should be installed in the CCD package in order to apply the pulse to the shift gate.

Further, since the clock pulse of the charge transfer parts utilize the voltage between 0 to +H volt, the surface of the channel of the charge transfer part is not in the accumulation state. Thus, there is a problem that a leakage charge generated in the surface flows.

Since the shift gate 21 should be formed of polysilicon, in order to isolate it from the polysilicon of the charge transfer part, e.g., 13 or 14, the length of the region 30' of the substrate 30 where the photodiode communicates with the charge transfer part should be enlarged. Thus, when the shift gate enters the ON state, the distance that the signal charge should be passed is large, so that it takes a long time. Accordingly, the image lag phenomenon is liable to be caused. In order to prevent this phenomenon, the potential step of the photodiode and the charge transfer part should be enlarged.

SUMMARY OF THE INVENTION

In order to solve the aforementioned conventional problems, it is an object of the present invention to provide a linear CCD in which the need for shift gates is eliminated and the charge outlets of the photodiode array and the charge transfer part are connected to each other without shift gates interposed therebetween.

In the linear CCD of the present invention, the arrangement of the photodiode and charge transfer part, and the method of applying the clock pulse to the charge transfer part are different from those in the conventional CCD shown in FIG. 1.

To accomplish the object of the present invention, there is provided a linear CCD (charge-coupled device) comprising: a photodiode-array having a plurality of photodiodes for converting light incident thereon into a plurality of charges, respectively; and a charge transfer part for transferring the charges of said photodiodes during a first phase of a first and second clock signal and for moving said charges signal during a second phase of said first and second clock signals. The charge transfer part includes: a plurality of first shift electrodes connected to said photodiodes, respectively, for forming potential wells that receive charges from said photodiodes, respectively, during said first phase of said first and second clock signals; and a plurality of second shift electrodes located between said first shift electrodes, respectively, for forming potential wells that receive said charges from said potential wells of said first shift electrodes during said second phase of said first and second clock signals.

The second clock signal of the CCD of the present invention is an inverted version of said first clock signal during said second phase. The first clock signal is applied to said first shift electrodes and said second clock signal is applied to said second shift electrode.

The first and second clock signals of the CCD of the present invention range between 0 volts and −H volts, where H is a positive integer, during said second phase. The first clock pulse includes, during said first phase, a pulse of +k volts, where k is a positive number and k>H, e.g., k≈2H.

In the CCD of the present invention, regions of the substrate below said first shift electrodes and said second shift electrodes are N type regions and N type regions, respectively. The CCD further comprises an insulating film for insulating said first and second shift electrodes from said N type regions and said N⁻ type regions.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein . . .

DETAILED DESCRIPTION OF THE INVENTION

Hereinafter, the present invention will be described with reference from FIG. 4 to FIG. 8.

Figure 4A:
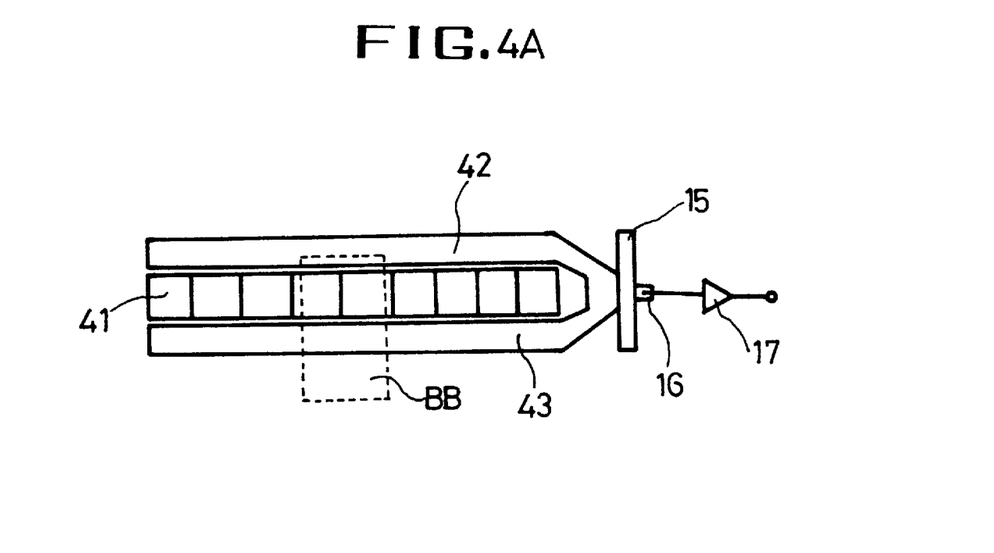
FIG. 4A is a layout diagram of a linear CCD according to the present invention.
Figure 4B:
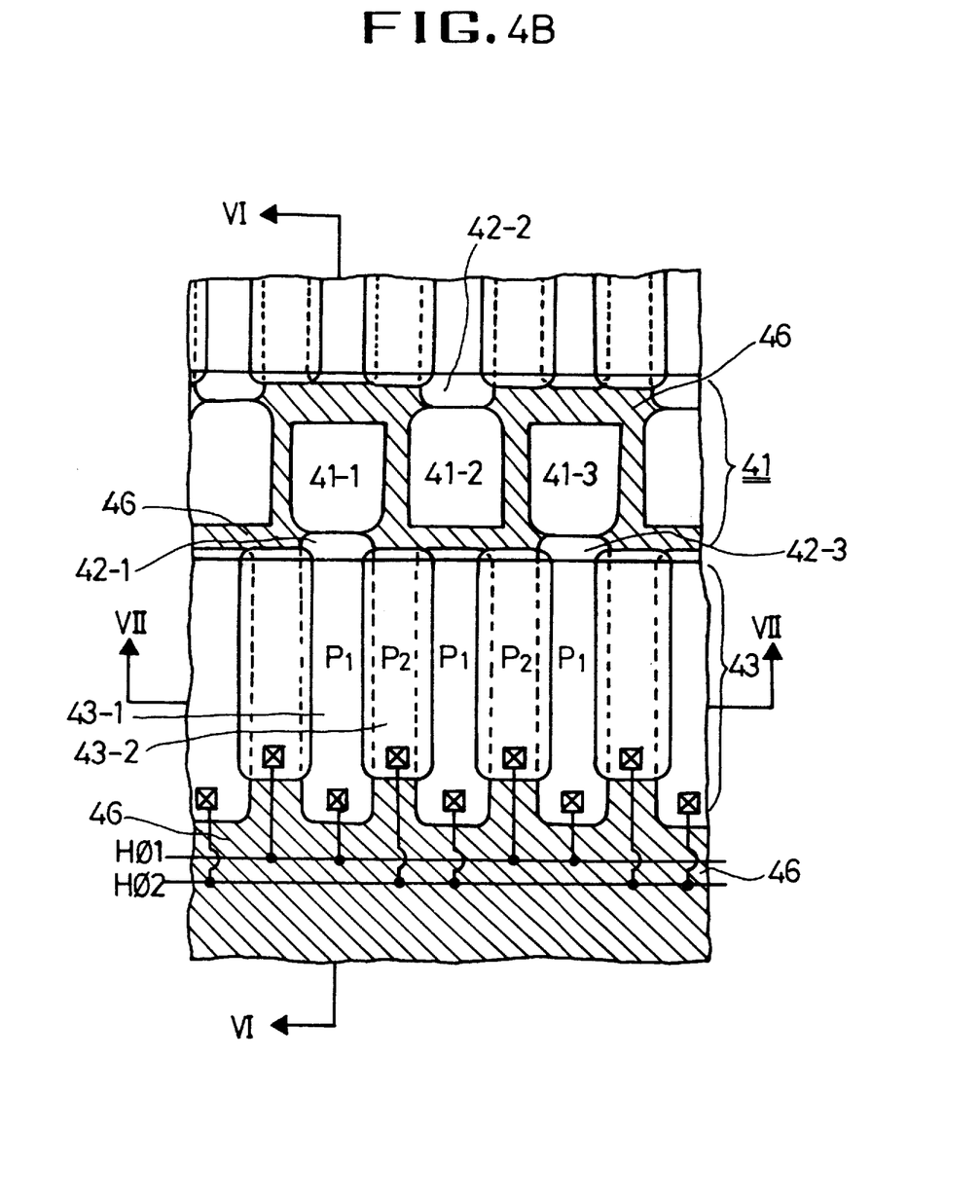
FIG. 4B is a more detailed diagram of the portion BB of FIG. 4A.
Figure 6A:
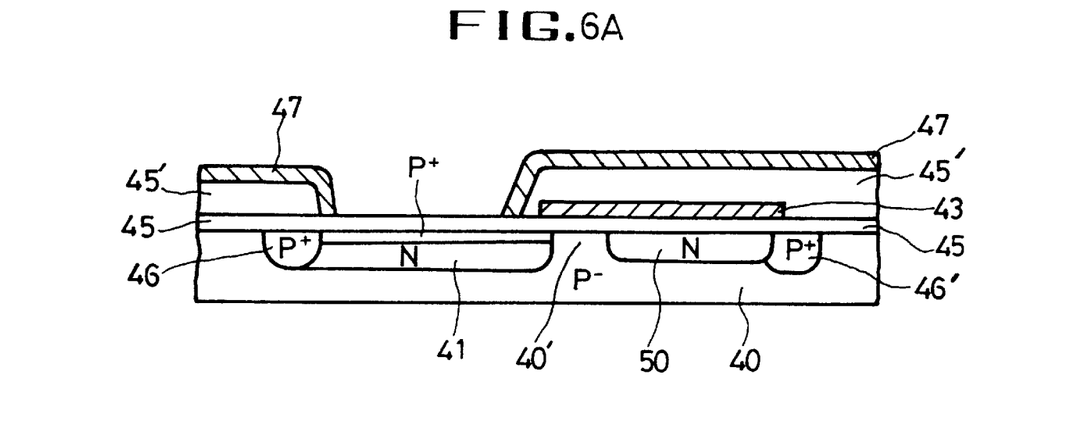
FIG. 6A is a cross-sectional view taken along view-line VI—VI in FIG. 4.

The linear CCD of the present invention is as shown in FIGS. 4A and 4B and FIG. 6A. Particularly, it comprises a photodiode-array 41 and charge transfer parts 42 and 43 formed above and below the photodiode array.

Photodiodes 41-1, 41-2, 41-3, . . . , 41-n are arranged in a line 41 in a semiconductor substrate 40. Passing each other up and down, charge outlets 42-1, 42-2, . . . , 42-n of the respective photodiodes 41-1, 41-2, . . . , 41-n are arranged in regular order.

Above the respective charge outlet 42-1, 42-2, . . . , 42-n, a first shift electrode (P1) 43-1 is formed on an insulating layer 45, and a second shift electrode (P2) 43-2 is formed on the side of first shift electrode (P1). The shift electrodes P1 and P2 form a pair and such pairs are successively arranged in a line. In charge transfer part 43, two pairs of first shift electrode 43-1 and second shift electrode 43-2 are arranged between charge outlet 42-1 and the next charge outlet 42-3.

An N type region 50-1 is formed in the substrate below first shift electrode 43-1, and an N⁻ type region 50-2 is formed in the substrate below second shift electrode 43-2. Between these regions 50-1 and 50-2 and electrodes 43-1 and 43-2, an insulating layer 45 exists. Thus, the charge transfer part 43 has pairs of a plurality of first shift electrode P1 and second shift electrode P2, N type regions 50-1 and N⁻ type regions 50-2 formed in the substrate, and insulating layer 45 for insulating these electrodes and regions.

The first shift electrodes are connected together and the second shift electrodes are connected together by clock pulse lines of Hφ1 and Hφ2, respectively. For example, a pair (of the first shift electrode P1 and the second shift electrode P2) located on the outlet side of photodiode 41-1 is connected to the clock pulse lines Hφ1 and Hφ2, respectively. Such a connection state may be changed by changing the clock lines when designing a system.

Further, on the external side of the photodiode-array 41 and the charge transfer part 43, channel stop regions 46 and 46' are formed by P⁺ type regions. A light-shielding film 47 is formed to cover the region excluding the light-receiving part of the photodiode.

In addition, an output gate (OG) 15 transmitting the charge transferred from the charge transfer part to an output terminal, a floating diffusion FD 16 receiving the charge transferred in a floating state to transmit it to a sense amp 17, sense amp 17, and clock pulse lines Hφ1 and Hφ2 are formed.

The operation of a CCD according to present invention will be described with reference to FIG. 5, FIG. 7B and FIG. 8B.

Figure 5:
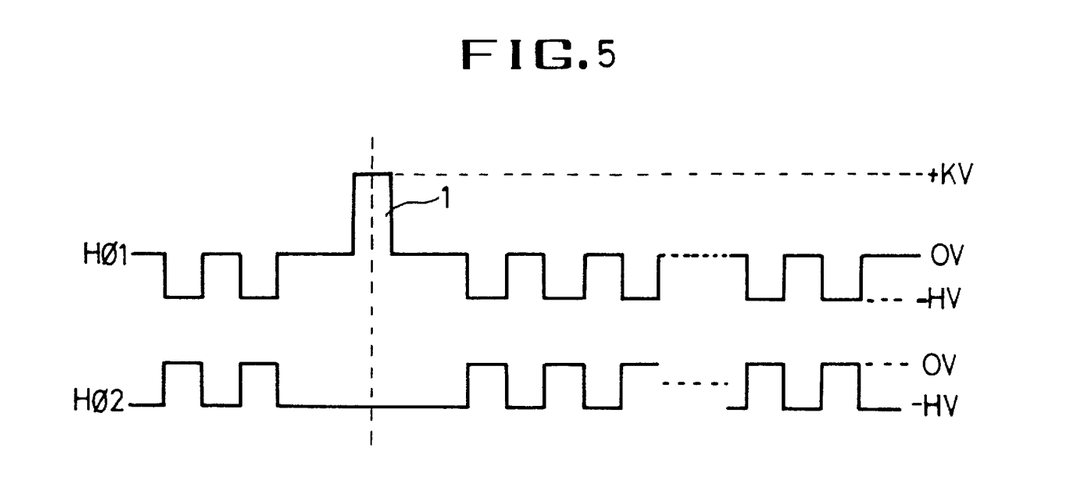
FIG. 5 shows clock waveforms applied to shift electrodes according to the present invention.

As shown in FIG. 5, a method of transferring the photoelectric converted charge (image signal) in the photodiode to the charge transfer part is performed by applying a pulse 1 of +k volts (V) in a first phase, i.e., in a period during which the clock of the charge transfer part is blanked.

Figure 6B:
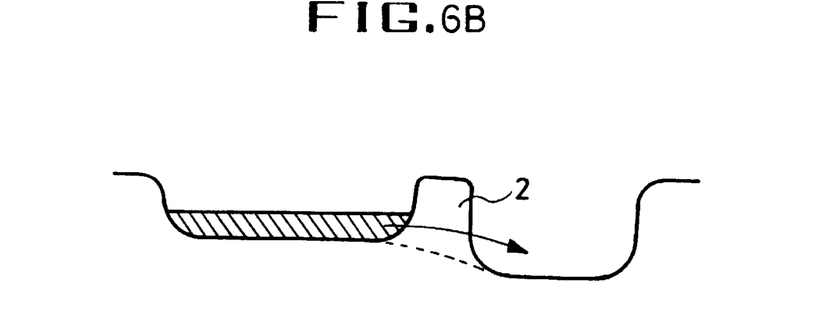
FIG. 6B is a voltage level diagram corresponding to FIG. 6A.

In the initial stage of the blank period, the clock Hφ1 has a value of "0" V, and the clock Hφ2 has a value of "−H" V. In the region 40' connecting the photodiode, e.g., 41-1, and the N type region 50-1 (P1) of the charge transfer part, as shown in FIG. 6A, a voltage of "0" V is applied to the P1, so that a potential step 2 remains, as depicted in FIG. 6B.

If a voltage of +k V where k>H, e.g., k∓2H, is applied to the first shift electrode 43-1 of shift electrode 43 and the clock Hφ2 remains at −H V, a channel connecting the photodiode and the N type region (P1) of the charge transfer part is formed (because the path of the charge is opened). Thus, as shown in FIG. 6B, the potential of the charge transfer part becomes lower than that of the photodiode, e.g., 41-1, (is lowered as shown in dotted line), thereby transferring the charge of the photodiode to N type region (P1) 50-1 of the charge transfer part. Such state that the charge is transferred is shown in FIG. 7B.

After the charge is transferred to the charge transfer part 50-1, the clock Hφ1 is set to "0" V and the clock Hφ2 is set to a potential of "−H" V, as in the initial stage of the blank period. Thus, in the region 40' connecting the photodiode, e.g., 41-1, and the N type region (P1) 50-1 of the charge transfer part, a potential step 2 is formed again. Thus, the photodiode and the charge transfer part are blocked from each other.

Then, when the blank period is over, i.e., during the second phase, there is applied clock pulses Hφ1 and Hφ2 of the waveforms shown in FIG. 5. That is, pulses varying from "0" to "−H" V are applied to transfer the charge, as shown in FIG. 8B.

Figure 7A:
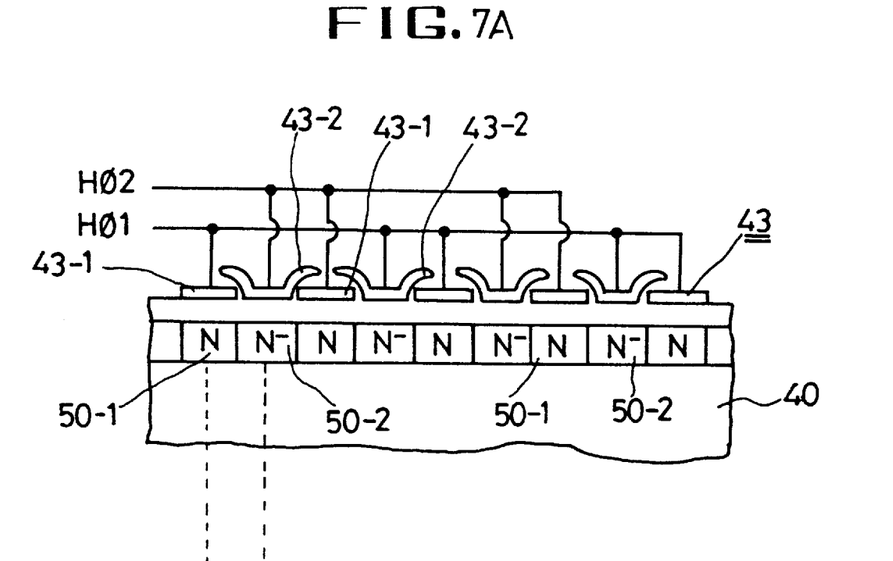
FIG. 7A is a partial cross-sectional view of the charge transfer part of the linear CCD according to the present invention.
Figure 7B:
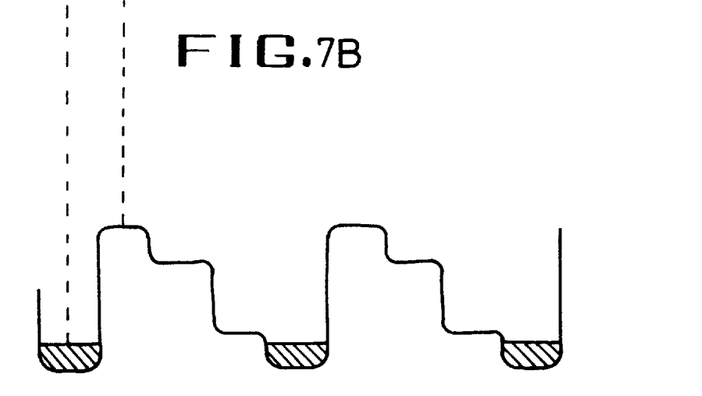
FIG. 7B shows a potential distribution for illustrating the operation of FIG. 7A.
Figure 8A:
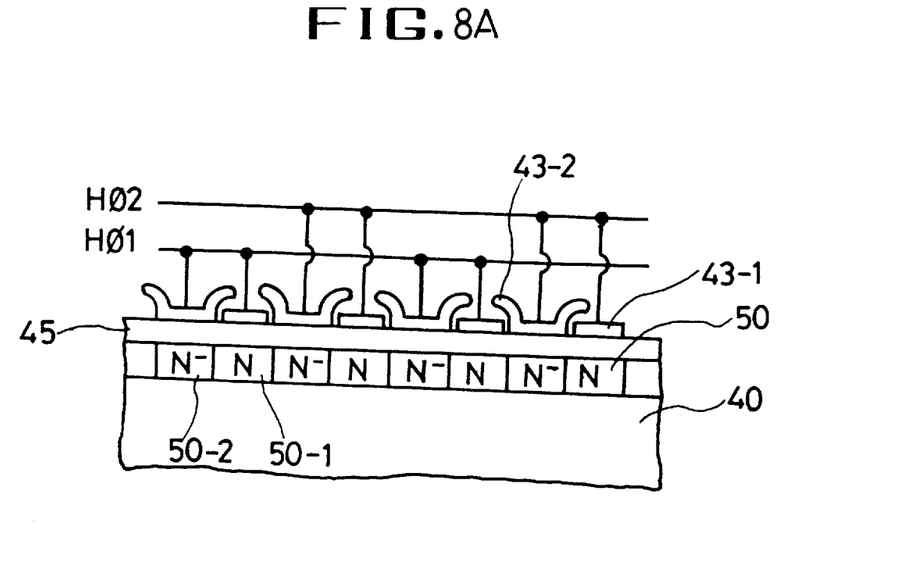
FIG. 8A is a partial cross-sectional view of the charge transfer part of the linear CCD according to the present invention.
Figure 8B:
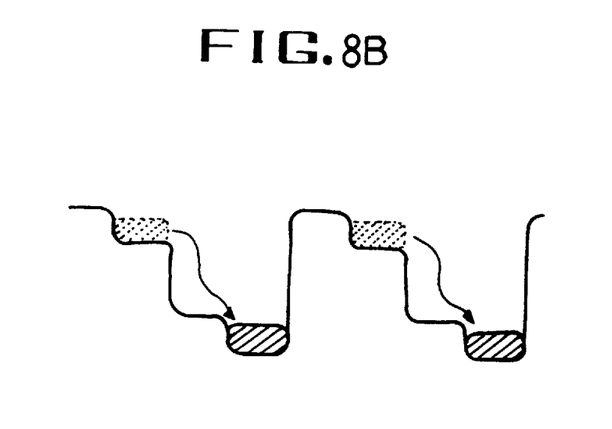
FIG. 8B shows a potential distribution for illustrating the operation of FIG. 8A.

Considering a process of transferring the charge, as shown in FIG. 7B, the height of a potential well created below the P1 on the outlet side of the photodiode is lowest (this is explained on the assumption that the charge flows like water), so that the charges are accumulated therein. However, if the clock cycle is changed so that the Hφ1 becomes "−H" V and the Hφ2 becomes "0" volt, the potential well is varied as shown in FIG. 8B. That is, the lowest well moves aside, so that the charges are transferred to the lowest well.

Such operation is repeated continuously whenever the clock pulse is changed, thereby transferring the charges. Finally, passing OG 15 and FD 16, the signal is amplified in, and output by, sense amp 17.

As described above, in the present invention, because the two shift gates are eliminated as compared to the conventional linear CCD, the structure is simplified. Further, the length of the region connecting the photodiode and the charge transfer part is reduced to more quickly transfer the charge.

In addition, when the signal charge is transferred to the charge transfer part, it is transferred under the potential well of the charge transfer part. Thus, the potential step with the photodiode is enlarged (i.e., the internal electric field is enlarged), thereby improving the image lag characteristics.

Since no shift gate is required, the number of the external pins can be reduced, thereby simplifying the structure of the package. Since the charge transfer part is operated in the accumulation mode, the surface generating charge is suppressed to reduce the low leakage current.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A charge coupled device (CCD) comprising:

a substrate;

a photo diode array, having a plurality of photodiodes, formed in said substrate;

a charge transfer part, formed in said substrate, for transferring charge from said photodiodes out of said CCD according to clock signals, said charge transfer part including:

a plurality of first shift electrodes formed over said substrate and proximately to said photodiodes such that no shift gates are interposed therebetween; and a plurality of second shift electrodes formed over said substrate and interposed between said first shift electrodes; and a plurality of third shift electrodes formed over said substrate and interposed between said first and second shift electrodes, wherein said first, second and third shift electrodes have different sizes.

2. The linear CCD as claimed in claim 1, wherein said first shift electrodes and said third shift electrodes are arranged above and below said photodiode-array.

3. The linear CCD as claimed in claim 1, wherein selected ones of said first shift electrodes are located partially over charge outlets of said photodiodes, and said first shift electrodes and third shift electrodes are arranged such that sides thereof, respectively, partially overlap.

4. The linear CCD as claimed in claim 1, wherein said clock signals include a first clock signal and a second clock signal each having a first phase and a second phase, said second clock signal being an inverted version of said first clock signal during said second phase, said first clock signal being applied to said first shift electrodes and said second clock signal being applied to said third shift electrodes.

5. The linear CCD as in claim 4, wherein:

said first and second clock signals range between 0 volts and −H volts, where H is a positive integer, during said second phase; and said first clock pulse includes, during said first phase, a pulse of +k volts, where k is a positive number and k>H.

6. The linear CCD as in claim 5, wherein k is approximately twice H.

7. The linear CCD as claimed in claim 1, wherein regions in said substrate below said first shift electrodes and said third shift electrodes are N type regions and N⁻ type regions, respectively, and said CCD further comprises an insulating film for insulating said first and third shift electrodes from said N type regions and said N⁻ type regions.

* * * * *

UNITED STATES PATENT AND TRADEMARK OFFICE
CERTIFICATE OF CORRECTION

PATENT NO. : 5,869,853
DATED : February 9, 1999
INVENTOR(S) : Young-Jun YU

It is certified that error appears in the above-identified patent and that said Letters Patent is hereby corrected as shown below:

On the title page,

--[30] Foreign Application Priority Data

Jan. 18, 1996 [KR] Rep. of Korea ..................................................1996-982--

Signed and Sealed this

Twenty-fourth Day of August, 1999

Attest:

Q. TODD DICKINSON

*Attesting Officer*  *Acting Commissioner of Patents and Trademarks*